(12) United States Patent
Tanaka et al.

(10) Patent No.: US 7,267,724 B2
(45) Date of Patent: Sep. 11, 2007

(54) THIN-FILM DISPOSITION APPARATUS

(75) Inventors: Masahiko Tanaka, Tokyo (JP);
Manabu Ikemoto, Kanakgawa-ken (JP); Naoaki Yokogawa, Tokyo (JP)

(73) Assignee: Anelva Corporation, Fuchu-Shi, Tokyo (JP)

( * ) Notice: Subject to any disclaimer, the term of this patent is extended or adjusted under 35 U.S.C. 154(b) by 0 days.

(21) Appl. No.: 09/862,458

(22) Filed: May 23, 2001

(65) Prior Publication Data
US 2002/0152960 A1    Oct. 24, 2002

(30) Foreign Application Priority Data
Jun. 23, 2000  (JP) .............................. 2000-188667

(51) Int. Cl.
C23C 16/00 (2006.01)
C23F 1/00 (2006.01)
H01L 21/306 (2006.01)

(52) U.S. Cl. .............. 118/715; 118/723 R; 156/345.33; 156/345.34

(58) Field of Classification Search ................. 118/715, 118/723 R; 156/345.33, 345.34; 204/298.07, 204/298.33
See application file for complete search history.

(56) References Cited

U.S. PATENT DOCUMENTS

| | | | |
|---|---|---|---|
| 4,792,378 A | | 12/1988 | Rose et al. |
| 5,102,523 A | * | 4/1992 | Beisswenger et al. . 204/298.33 |
| 5,336,326 A | | 8/1994 | Karner et al. |
| 5,356,515 A | * | 10/1994 | Tahara et al. ................ 438/715 |
| 5,433,786 A | * | 7/1995 | Hu et al. .................. 118/723 E |
| 5,433,787 A | | 7/1995 | Suzuki et al. |
| 5,449,410 A | | 9/1995 | Chang et al. |
| 5,472,565 A | * | 12/1995 | Mundt et al. .................. 216/71 |
| 5,525,159 A | | 6/1996 | Hama et al. |
| 5,556,474 A | | 9/1996 | Otani et al. |
| 5,614,026 A | * | 3/1997 | Williams ............. 118/723 ME |
| 5,624,498 A | * | 4/1997 | Lee et al. .................... 118/715 |
| 5,628,829 A | * | 5/1997 | Foster et al. ............. 118/723 E |
| 5,766,364 A | * | 6/1998 | Ishida et al. ................. 118/725 |
| 5,942,075 A | | 8/1999 | Nagahata et al. |
| 6,026,764 A | | 2/2000 | Hwang |
| 6,074,518 A | | 6/2000 | Imafuku et al. |

(Continued)

FOREIGN PATENT DOCUMENTS

JP    5-21393    1/1993

(Continued)

OTHER PUBLICATIONS

Robert C. Reid et al. "Lennard-Jones Potentials as Determined from Viscosity Data (Appendix B)", *The Properties of Gases and Liquids*, McGraw-Hill, Inc., Copyright 1987, p. 734, Index.

(Continued)

*Primary Examiner*—Karla Moore
(74) *Attorney, Agent, or Firm*—Buchanan Ingersoll & Rooney PC

(57) ABSTRACT

A dividing plate for a thin-film deposition apparatus divides the interior of the vacuum reaction chamber into a plasma discharge space and a film deposition process space, by fixing or connecting a plurality of laminated plates together by securely bonding them over the entire area of their interfacial surfaces, or a large portion thereof.

24 Claims, 4 Drawing Sheets

U.S. PATENT DOCUMENTS

| | | | |
|---|---|---|---|
| 6,083,363 | A * | 7/2000 | Ashtiani et al. ....... 204/298.01 |
| 6,086,677 | A * | 7/2000 | Umotoy et al. ............. 118/715 |
| 6,089,472 | A * | 7/2000 | Carter ........................ 239/422 |
| 6,203,620 | B1 * | 3/2001 | Moslehi .................. 118/723 R |
| 6,206,972 | B1 * | 3/2001 | Dunham ..................... 118/715 |
| 6,245,192 | B1 * | 6/2001 | Dhindsa et al. ........ 156/345.34 |
| 6,245,396 | B1 * | 6/2001 | Nogami ...................... 427/562 |
| 6,302,964 | B1 * | 10/2001 | Umotoy et al. ............. 118/715 |
| 6,368,987 | B1 * | 4/2002 | Kopacz et al. ............. 438/788 |
| 6,435,428 | B2 * | 8/2002 | Kim et al. .................. 239/553 |

FOREIGN PATENT DOCUMENTS

| | | |
|---|---|---|
| JP | 6-260434 | 9/1994 |
| JP | 7-201749 | 8/1995 |
| JP | 8-167596 | 6/1996 |
| JP | 2-601127 | 1/1997 |
| JP | 2837087 | 10/1998 |
| JP | 11168094 A * | 6/1999 |

OTHER PUBLICATIONS

R. Byron Bird et al. "Diffusivity and the Mechanisms of Mass Transport; Theory of Ordinary Diffusion in Gases at Low Density", *Transport Phenomena*, John Wiley & Sons, Inc., Copyright 1960, p. 508-513.

A new technique for diagnostics of a radio-frequency parallel-plate remote plasma; N. Sano et al.; Appl. Phys. Lett 65 (2), Jul. 11, 1994 pp. 162-164.

Infrared spectroscopic study of $SiO_x$ films produced by plasma enhanced chemical vapor deposition; J. Vac.Sci. Technol. A4(3), May/Jun. 1986; pp. 689-694.

Improvement of structural and electrical properties in low-temperature gate oxides for poly-Si TFTs by controlling $O_2/Sih_4$ ratios; AM-LCD 1997; pp. 87-90.

"Flow of Atoms and Molecules—Rarefied Gas Dynamics and its Applications", section 2.6.4, The Japan Society of Mechanical Engineers, 1996, Kyoritsu Shuppan Co., Ltd.

Shingo Kadomura et al., Anisotropic Etching Using Deposition of Sulfur, Sony Corporation, Semiconductor World, Jan. 1993, pp. 1-11, and translation.

Ken Fujita et al., "X-Ray Photoelectron Spectroscopic Studies on Pyrolysis of Plasma-Polymerized Fluorocarbon Films on SI", Jpn. J. Appl. Phys. vol. 34 (1995), pp. 304-306, Part 1, No. 1, Jan. 1995.

Riccardo d'Agostino et al., "Plasma Etching of Si and $SiO_2$ in $SF_6$-$O_2$ Mixtures", J. Appl. Phys. 52(1), Jan. 1981, pp. 162-167.

* cited by examiner

[Figure 2]
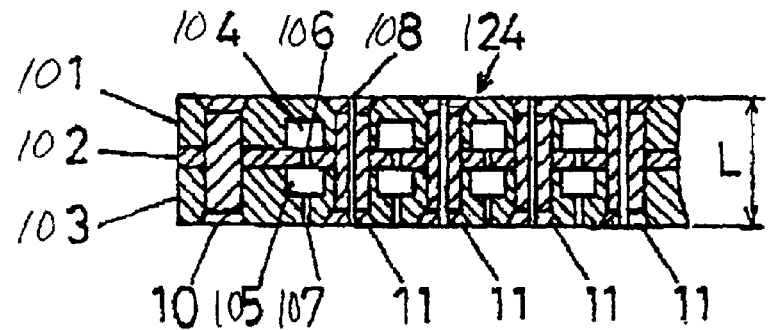
[Figure 3]
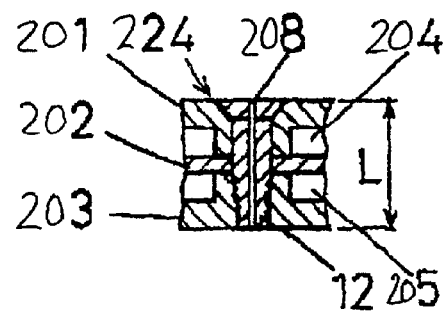
[Figure 4]
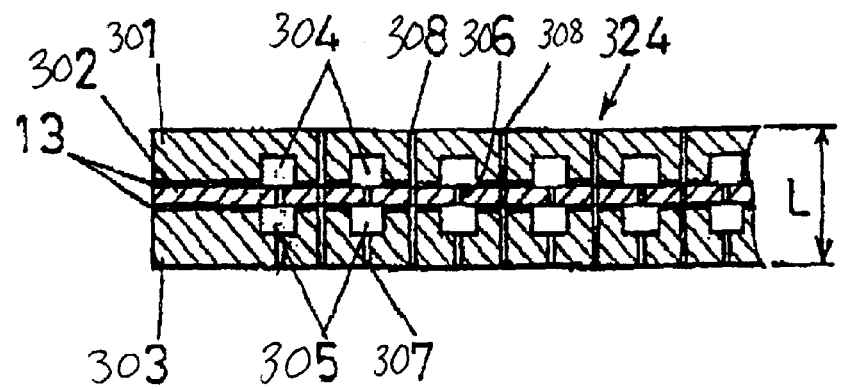

[Figure 5]
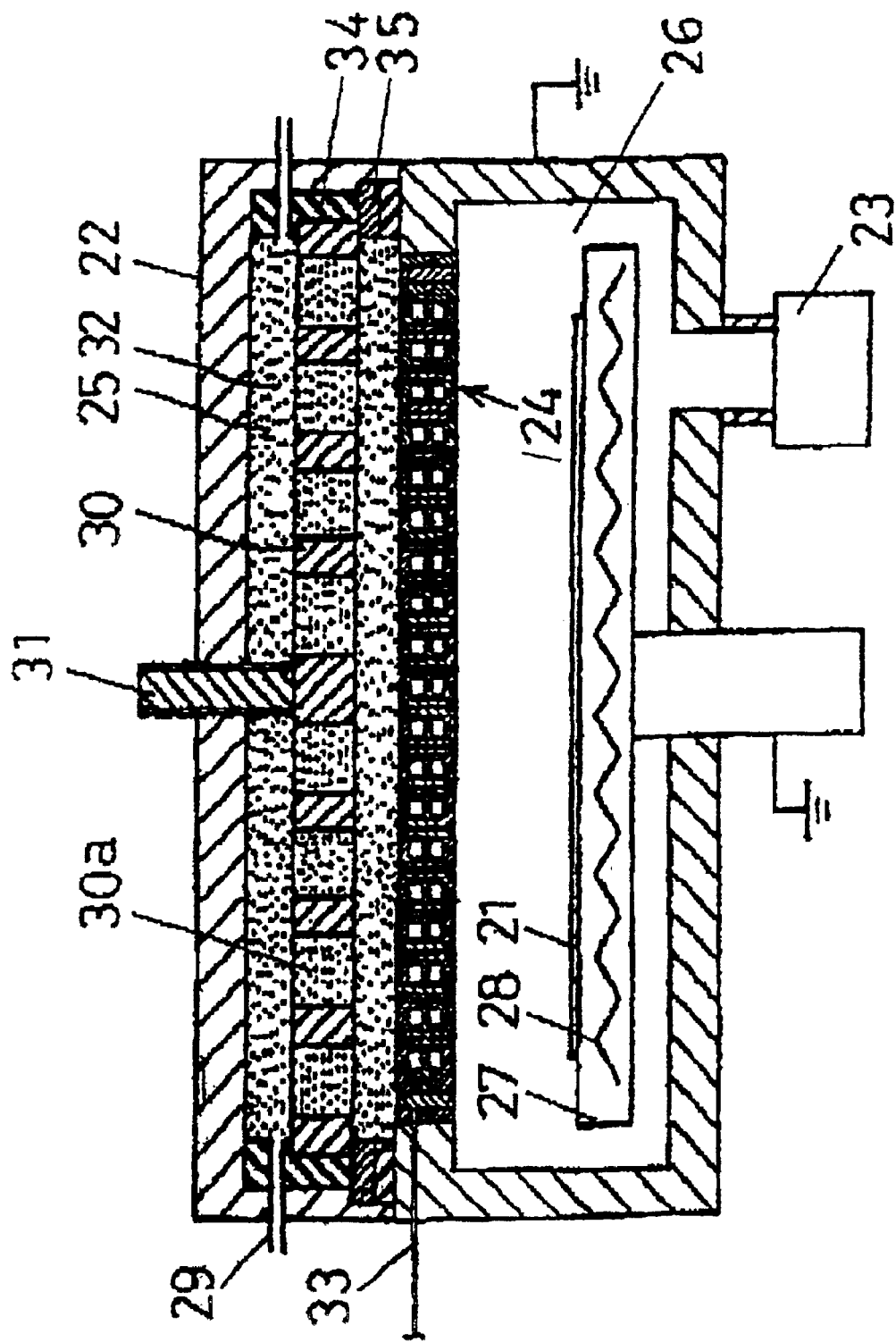

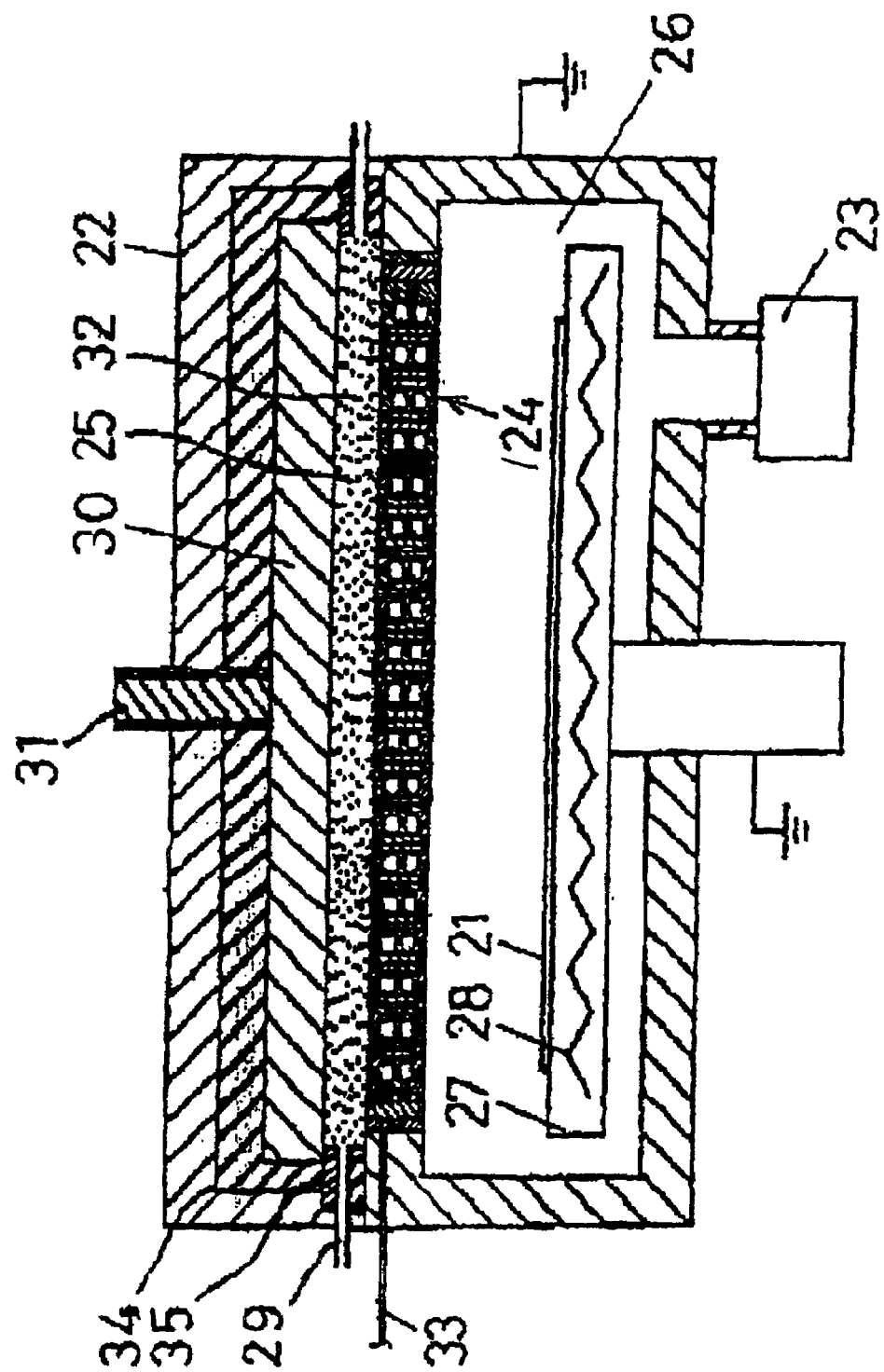
[Figure 6]

THIN-FILM DISPOSITION APPARATUS

CROSS-REFERENCE TO RELATED APPLICATIONS

This application claims priority of Japanese Patent Application No. 2000-188667, filed in Japan on Jun. 23, 2000, the entire contents of which are hereby incorporate herein by reference.

BACKGROUND OF THE INVENTION

1. Field of the Invention

The present invention relates to chemical vapor deposition (referred to herein as "CVD"), and in particular, it relates to a CVD apparatus suitable for depositing films on large-scale flat panel substrates.

2. Description of Related Art

Known methods for the production of large-scale liquid crystal displays include methods that use high-temperature polysilicon TFTs (thin film transistors) and methods that use low-temperature TFTs. In liquid crystal display production methods that use low-temperature polysilicon TFTs, there is no need to use expensive substrates such as quartz because all the processes can be performed at a low temperature (e.g., 400° C. or less).

It is also possible to achieve cost reductions by increasing the production yield if the drive circuits for driving the devices in the liquid crystal displays, and like devices, are built into the substrate at the same time. Since this also has the effect of improving the TFT device characteristics, it makes it possible to increase the degree of detail and achieve a larger aperture ratio. Consequently, painstaking research is being undertaken with a view to achieving improved performance, and the volume of production itself is also increasing.

In the production of liquid crystal displays using low-temperature polysilicon TFTs, plasma CVD is used for the low-temperature deposition of polysilicon oxide films, which are suitable for use as gate insulation films.

For such applications, a CVD apparatus proposed in a previous patent application (U.S. patent application Ser. No. 09/435,625, the subject matter of which is hereby incorporated herein by reference) involves producing a plasma inside a vacuum enclosure to generate excited active species (referred to herein as "radicals") and using these radicals and a precursor gas to deposit a film on a substrate. Specifically, this apparatus uses a technique whereby a dividing plate, having a plurality of holes through which the radicals pass, is used to separate the interior of the vacuum enclosure into a plasma discharge space and a film deposition space. Radicals are generated from the plasma by introducing a gas into the plasma discharge space, and these radicals are introduced to the film deposition space through the plurality of holes in the above-mentioned dividing plate. Meanwhile, a precursor gas is directly introduced into the film deposition space from outside the vacuum enclosure without coming into contact with the above-mentioned plasma or radicals. The precursor gas is allowed to react with the above-mentioned radicals introduced into the film deposition space, whereby a film is deposited on a substrate (e.g., on a glass substrate measuring 370 mm×470 mm) situated in the film deposition space.

An example of a thin-film deposition apparatus used for plasma CVD that uses a dividing plate 24 to separate the interior of the vacuum enclosure into a plasma discharge space and a film deposition space is described using FIG. 1(a) and (b). FIG. 1(a) is a cross-sectional view of a conventional dividing plate 24, and FIG. 1(b) is a plan view of the interior as seen from line X-X in FIG. 1(a).

The dividing plate 24 consists of a three-plate laminated structure where an intermediate diffusion plate 2 is sandwiched between an upper plate 1 and a gas discharge plate 3 on the film deposition side, and these three plates are fixed at their outer perimeter. The fixing at the outer perimeter of these three plates (upper plate 1, intermediate diffusion plate 2, and gas discharge plate 3 on the film deposition side) can, for example, be achieved by using screw fixing members 9 as shown in the figure, or by welding or the like (not illustrated).

The dividing plate 24 consisting of three plates laminated and fixed in this way has spaces provided in the interior thereof, i.e., precursor gas primary diffusion spaces 4 and precursor gas secondary diffusion spaces 5, and these internal spaces 4, 5 are connected together by intermediate gas distribution holes 6. A precursor gas, which is fed from outside into the vacuum enclosure of the thin-film deposition apparatus, is uniformly diffused as it passes through, in sequential order, the precursor gas primary diffusion spaces 4, the intermediate gas distribution holes 6, and the precursor gas secondary diffusion spaces 5, and is then guided from the precursor gas discharge holes 7 into the film deposition process chamber (the lower part in FIG. 1(a)).

Meanwhile, radical transit holes 8 are provided in the parts where there are no spaces inside the dividing plate 24, and the radicals produced in the plasma discharge space (i.e., above the dividing plate 24) pass through these radical transit holes 8 and are guided into the film deposition process space below the dividing plate 24.

OBJECTS AND SUMMARY

In the above-mentioned conventional dividing plate structure, since the plurality of plates constituting the dividing plate (upper plate 1, intermediate diffusion plate 2, and gas discharge plate 3 on the film deposition side) are fixed at the outer perimeter thereof, there have been cases where gaps have appeared between plates (e.g., between upper plate 1 and intermediate diffusion plate 2, or between intermediate diffusion plate 2 and gas discharge plate 3 on the film deposition side) in regions close to the central part of the plates, where the plates are not fixed. In such cases, the radicals that pass through the radical transit holes 8 running through the said plurality of plates (upper plate 1, intermediate diffusion plate 2, and gas discharge plate 3 on the film deposition side) may penetrate through these gaps into the interior of the dividing plate. If this happens, the radicals that have penetrated through the gaps will come into contact with the precursor gas in places such as the precursor gas primary diffusion spaces 4 and precursor gas secondary diffusion spaces 5, and a reaction will take place inside the dividing plate. The products of this reaction can lead to the generation of particles, and this has led to problems in that it becomes impossible to provide an adequate supply of radicals into the film deposition process space.

The present invention provides a thin-film deposition apparatus incorporating a dividing plate equipped with radical passage holes and which has improved bonding between the plurality of plates constituting the dividing plate, and wherein—when radicals pass through from the plasma discharge space to the film deposition process space—there is little or no danger of radicals penetrating into the interior of the dividing plate.

A thin-film deposition apparatus according to the present invention produces a plasma inside a vacuum enclosure to generate active species and uses these active species and a precursor gas to deposit a film on a substrate.

In a thin-film deposition apparatus according to the present invention, the interior of the vacuum reaction chamber is divided by a dividing plate into a plasma discharge space and a film deposition process space. This dividing plate has internal spaces that are separated from the plasma discharge space and are connected to the film deposition process space. A plurality of holes pass through the dividing plate from the plasma discharge space to the film deposition process space. A gas is introduced into the plasma discharge space, where radicals are generated by the plasma, and these radicals are introduced into the film deposition process space via the plurality of holes in the dividing plate. Also, in this apparatus, a precursor gas is introduced directly into the film deposition process space from outside the vacuum enclosure, without coming into contact with the plasma or radicals, and in the film deposition process space, the radicals and precursor gas introduced thereto react together and a film is thereby deposited on a substrate positioned in the film deposition process space.

In the above-mentioned dividing plate, the plurality of laminated plates may be fixed or connected together by securely bonding them over either the entire area of their interfacial surfaces or over a large portion of their interfacial surfaces sufficient to prevent radicals from entering the internal spaces.

By securely bonding the plurality of laminated plates over the entire area or a large portion of their interfacial surfaces, this means that apart from the parts where the above-mentioned internal spaces and the above-mentioned plurality of holes are provided in the dividing plate, the plates are fixed or connected together in such a way that they are securely bonded together at all, or most of, the mutually contacting surfaces of mutually contacting plates.

In this way, since the plurality of laminated plates constituting the dividing plate are fixed or connected by securely bonding them together over the entire area or a large portion of their interfacial surfaces, it is possible to prevent or reduce the penetration of radicals from the plurality of holes connecting the plasma discharge space with the film deposition space, which are formed by piercing through the above-mentioned plurality of laminated plates, and it is thereby possible to prevent or reduce the radicals and precursor gas from coming into contact with each other inside the dividing plate.

Above, where it says fixed by securely bonding over the entire area or a large portion of their interfacial surfaces, this means that instead of just fixing the plates of the dividing plate together at the outer periphery thereof, it is possible to fix the plates together with metal fixings (e.g. rivets 11, metal fixings 12), which have holes in their interior to connect the plasma discharge space with the film deposition process space, located at positions over the entire dividing plate area, except where the above-mentioned interior spaces are provided inside the dividing plate, in such a way that the film deposition performance—e.g., the film deposition rate or uniformity—is made as uniform as possible.

Also, where it says connected together by securely bonding over the entire area or a large portion of their interfacial surfaces, this means that instead of just fixing the plates of the dividing plate together at the outer periphery thereof, it is possible to connect the plates together by vacuum soldering, pressure welding or the like at the interfacial surfaces over the entire dividing plate or a large portion thereof, except at parts where the above-mentioned plurality of holes connecting the plasma discharge space and the film deposition process space—which are disposed at positions chosen so as to optimize the film deposition performance such as the film deposition rate and uniformity—and the internal spaces are provided inside the dividing plate.

In the thin-film deposition apparatus according to the present invention, a dividing plate 124 adopts a structure wherein, as shown in FIG. 2, the interfacial surfaces of the plurality of laminated plates are securely bonded over their entire area or a large portion of it by caulking with a plurality of metal fixings (e.g. rivets 11), and the plurality of holes 108 provided in the dividing plate 124 can be provided by piercing through the metal fixings (e.g., rivets 11).

A dividing plate 224 may also adopt a structure wherein, as shown in FIG. 3, the interfacial surfaces of the above-mentioned plurality of laminated plates are securely bonded over their entire area or a large portion of it by screwing the plurality of laminated plates together with a plurality of metal fixings 12 provided with threaded parts on the outside thereof, and the plurality of holes 208 provided in dividing plate 224 can be provided by piercing through the metal fixings 12.

Furthermore, the interfacial surfaces of the plurality of laminated plates in a dividing plate 324 may be connected together by securely bonding them over their interfacial entire area or a large portion of it, as shown in FIG. 4, and the plurality of holes 308 provided in this dividing plate 324 can be formed by piercing through it at positions where the above-mentioned internal spaces 4, 5 are not disposed.

In all the dividing plate structures in the thin-film deposition apparatus according to the present invention, the plurality of laminated plates constituting the dividing plate are fixed by securely bonding them over the entire area of their interfacial surfaces or a large portion thereof, and the plurality of holes provided in the dividing plate connecting the plasma discharge space and the film deposition process space are preferably provided by piercing through each of the plurality of metal fixings used to achieve secure bonding of the interfacial surfaces of the plurality of laminated plates. Or alternatively, the plurality of holes may be formed by piercing through at positions where internal spaces are not disposed in the internal wall, which is connected together by securely bonding a plurality of laminated plates over their entire interfacial area, or a large portion thereof. Therefore, there is little or no danger of radicals penetrating into the interior of the dividing plate from the holes through which the radicals pass while the radicals pass through from the plasma discharge space to the film deposition process space.

In the deposition of a thin film on substrate 21, the film deposition performance, such as the film deposition rate and uniformity, is affected by the holes through which the radicals pass that are provided in dividing plate and disposed at positions opposite substrate 21; specifically, the performance is affected by the number and layout of the holes that connect the plasma discharge space with the film deposition process space. However, in a thin-film deposition apparatus according to the present invention, as mentioned above, it is possible for the holes through which the radicals pass to be provided at the same positions as where the plurality of laminated plates constituting the dividing plate are fixed together by a plurality of metal fixings. Therefore, in the present invention, the layout of the holes through which the radicals pass can be set by giving priority to the film deposition performance over the entire area of dividing plate, without being constrained by the positions at which the plurality of laminated plates constituting the dividing plate are fixed together, and it is possible to supply radicals to the film deposition process space from the plasma discharge space without them penetrating into the interior of dividing plate.

In the above-mentioned thin-film deposition apparatus according to the present invention, the above-mentioned plurality of holes through which the radicals pass are preferably formed so as to satisfy the condition uL/D>1, where u is the gas flow velocity inside these holes, L is the effective length of the holes (in the embodiments shown in FIGS. 2, 3 and 4, this length is equivalent to the thickness of dividing plate 24), and D is the gas interdiffusion coefficient (the gas interdiffusion coefficient of the precursor gas and the gas introduced in the plasma discharge space at the holes). In a thin-film deposition apparatus according to the present invention, the plasma discharge space and film deposition process space on either side of the dividing plate are only connected through the holes provided in the dividing plate, but as proposed in a previous patent application (U.S. patent application Ser. No. 09/435,625), if these holes satisfy the above-mentioned condition (uL/D>1), then it is possible to prevent the precursor gas introduced into the film deposition process space from diffusing back towards the plasma discharge space.

BRIEF DESCRIPTION OF THE DRAWINGS

FIG. 2 is a partially simplified cross-sectional view of a dividing plate employed in a thin-film deposition apparatus according to the present invention.

FIG. 3 is a partially simplified cross-sectional view of another dividing plate employed in a thin-film deposition apparatus according to the present invention.

FIG. 4 is a partially simplified cross-sectional view of a further dividing plate employed in a thin-film deposition apparatus according to the present invention.

FIG. 5 is a cross-sectional sketch illustrating one example of a thin-film deposition apparatus according to the present invention.

FIG. 6 is a cross-sectional sketch illustrating another example of a thin-film deposition apparatus according to the present invention.

DETAILED DESCRIPTION OF THE PREFERRED EMBODIMENTS

Figure 1A:
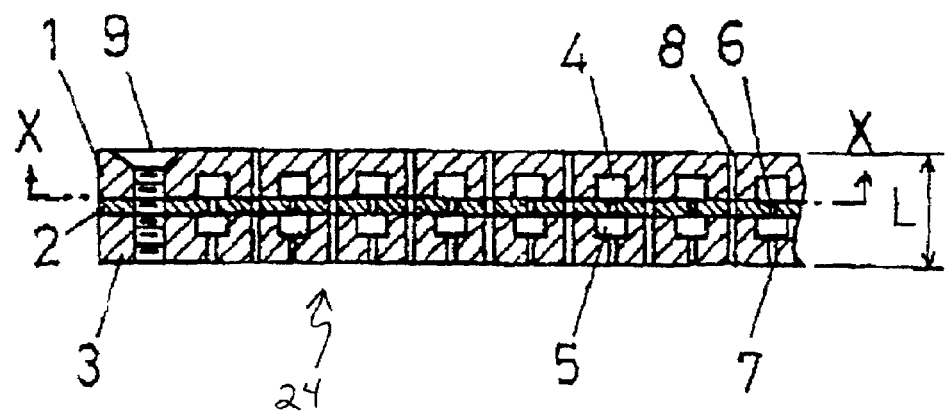
FIG. 1(a) is a cross-sectional view of the dividing plate in a conventional thin-film deposition apparatus.
Figure 1B:
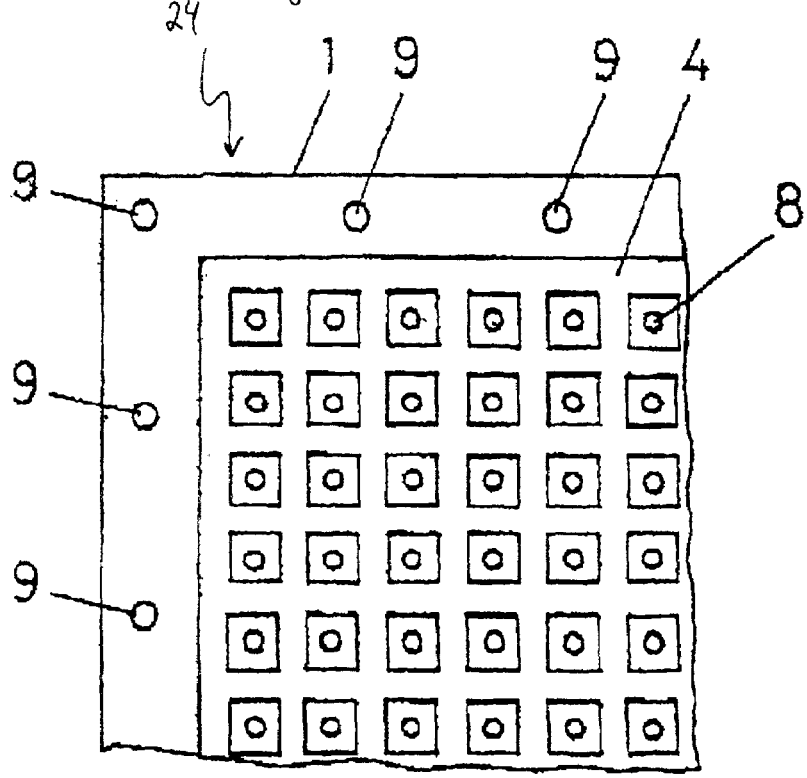
FIG. 1(b) is a partially simplified plan view of the interior as seen from line X-X in FIG. 1(a).

Preferred embodiments of the present invention are described below with reference to the attached figures.

FIG. 2 is a cross-sectional view of a preferred embodiment of a dividing plate 124, which divides the vacuum reaction chamber of a thin-film deposition apparatus according to this invention (an example of which is shown in FIG. 5) into a plasma discharge space 25 and a film deposition space 26.

Dividing plate 124 is formed by fixing together a plurality of laminated plates (upper plate 101, intermediate diffusion plate 102, and gas discharge plate 103 on the film deposition side) by securely bonding them over the entire area of their interfacial surfaces or a large portion thereof (i.e., between upper plate 101 and intermediate diffusion plate 102, and between intermediate diffusion plate 102 and gas discharge plate 103 on the film deposition side) with a plurality of metal fixings, in this case by caulking with rivets 10, 11. As used herein, the term interfacial surfaces refers to the portions of the laminated plates that are in direct contact with a portion of an adjacent laminated plate.

Internal spaces (precursor gas primary diffusion spaces 104, intermediate gas distribution holes 106, source gas secondary diffusion spaces 105) are formed in dividing plate 124, which is made as described above by laminating and fixing upper plate 101, intermediate diffusion plate 102, and gas discharge plate 103 on the film deposition side, in such a way that they are separated from plasma discharge space 25 and connect with film deposition process space 26.

Since a structure of this sort is employed, the gas supplied from the outside first enters precursor gas primary diffusion spaces 104 where it is diffused, after which it passes through intermediate gas distribution holes 106 and enters source gas secondary diffusion spaces 105; as it travels along this path, it is uniformly diffused, and it is then guided directly from precursor gas discharge holes 107 into film deposition process space 26, i.e., without coming into contact with the plasma or radicals.

Note that in FIG. 2, rivets 10 are used to perform fixing at the outer perimeter of the plurality of laminated plates (upper plate 101, intermediate diffusion plate 102, and gas discharge plate 103 on the film deposition side), whereas rivets 11 are used to fix the parts other than the periphery.

As FIG. 2 shows, in the dividing plate 124 of the thin-film deposition apparatus according to this invention, the holes 108 that are pierced through it to allow the transit of radicals are provided in the rivets 11 that fix the plurality of laminated plates (upper plate 101, intermediate diffusion plate 102, and gas discharge plate 103 on the film deposition side) together by securely bonding them over the entire area of their interfacial surfaces, except at the outer periphery thereof.

As a result, the holes 108 through which the radicals pass are separated from the spaces inside dividing plate 124 (precursor gas primary diffusion spaces 104, intermediate gas distribution holes 106, source gas secondary diffusion spaces 105) by the constituent outer walls of the rivets 11, and there is no penetration of radicals into the spaces inside dividing plate 124 while the radicals are introduced from plasma discharge space 25 (at the top of FIG. 2) to film deposition process space 26 (at the bottom of FIG. 2).

FIG. 3 shows a cross-sectional view of another preferred embodiment of a dividing plate 124, which divides the vacuum reaction chamber of a thin-film deposition apparatus according to this invention into a plasma discharge space 25 (at the top of FIG. 3) and a film deposition process space 26 (at the bottom of FIG. 3).

The dividing plate 224 shown in FIG. 3 differs from that shown in FIG. 2 in that the rivets 11 are replaced with metal fixings 12 provided with threaded parts on the outside thereof, a plurality of metal fixings 12 being used to screw together the plurality of laminated plates (upper plate 201, intermediate diffusion plate 202, and gas discharge plate 203 on the film deposition side), thereby securely bonding these laminated plates over the entire area of their interfacial surfaces or a large portion thereof. The holes 208 through which the radicals pass are provided by piercing through metal fixings 12.

In the embodiment shown in FIG. 3, female threaded parts are provided in the gas discharge plate 203 on the film deposition side, and using metal fixings 12 provided with male threaded parts on the outside at the ends thereof, the metal fixings 12 which are inserted from the top of the plurality of laminated plates (upper plate 201, intermediate diffusion plate 202, and gas discharge plate 203 on the film deposition side) are screwed into the female threaded parts of the above-mentioned gas discharge plate 203 on the film deposition side, whereby metal fixings 12 are screwed to the plurality of laminated plates, and the plurality of laminated plates (upper plate 201, intermediate diffusion plate 202, and gas discharge plate 203 on the film deposition side) are thereby fixed by securely bonding them over the entire area of their interfacial surfaces.

In the embodiment shown in FIG. 3, as in the embodiment shown in FIG. 2, as the radicals are guided from plasma discharge space 25 (at the top of FIG. 3) to the film deposition process space 26 (at the bottom of FIG. 3), the holes 208 through which the radicals pass are separated from the spaces inside dividing plate 224 (precursor gas primary diffusion spaces 204, intermediate gas distribution holes 206, source gas secondary diffusion spaces 205) by the constituent outer walls of metal fixings 12, and while the radicals are introduced from plasma discharge space 25 to film deposition process space 26, there is no penetration of radicals into the spaces inside dividing plate 224.

In the embodiment shown in FIG. 3, to securely bond the plurality of laminated plates (upper plate 201, intermediate diffusion plate 202, and gas discharge plate 203 on the film deposition side) at their interfacial surfaces, metal fixings 12 provided with threaded parts on the outside thereof are used to screw the plurality of laminated plates together, and since these metal fixings 12 can be attached and removed using screw-type connections, the metal fixings 12 can be easily replaced. Therefore, by suitably replacing metal fixings 12, it is easy to modify the diameter or profile of the holes 208 through which the radicals pass.

In the embodiments shown in FIGS. 2 and 3, cases were described in which the length of metal fixings 12 and rivets 11, which have holes 108, 208 through which the radicals pass, matches the thickness of the plurality of laminated plates. However, this does not necessarily have to be the case, and the same action and effects may be obtained when the rivets 11 and metal fixings 12 are shorter or longer than the thickness of the plurality of laminated plates.

FIG. 4 shows a cross-sectional view of a further preferred embodiment of dividing plate 324 where the vacuum reaction chamber of the thin-film deposition apparatus of this invention is separated into a plasma discharge space 25 (at the top of FIG. 4) and a film deposition process space 26 (at the bottom of FIG. 4).

The dividing plate 324 shown in FIG. 4 is such that the plurality of laminated plates (upper plate 301, intermediate diffusion plate 302, and gas discharge plate 303 on the film deposition side) are connected together by securely bonding over the entire area of their interfacial surfaces (i.e., between upper plate 301 and intermediate diffusion plate 302, and between intermediate diffusion plate 302 and gas discharge plate 303 on the film deposition side). Internal spaces (precursor gas primary diffusion spaces 304, intermediate gas distribution holes 306, source gas secondary diffusion spaces 305), which are separated from the plasma discharge space 25 and connect with the film deposition process space 26, are provided in the same way as in the dividing plates 124, 224 shown in FIGS. 2 and 3, but here the plurality of holes 308 through which the radicals pass are formed by piercing through at positions where the above-mentioned internal spaces are not disposed.

A method such as vacuum soldering, pressure welding or the like can be used to achieve secure bonding over the entire area or a large portion thereof of the interfacial surfaces of the plurality of laminated plates (i.e. between upper plate 301 and intermediate diffusion plate 302, and between intermediate diffusion plate 302 and gas discharge plate 303 on the film deposition side).

In FIG. 4, the parts identified by reference numeral 13 represent the connecting parts of the interfacial surfaces of upper plate 301, intermediate diffusion plate 302, and gas discharge plate 303 on the film deposition side.

As shown in FIG. 4, the closely bonded joints made over the entire interfacial surface area (or a large portion thereof) of the plates are preferably made by connecting the interfacial surfaces of the plurality of laminated plates (upper plate 301, intermediate diffusion plate 302, and gas discharge plate 303 on the film deposition side) except at the parts where there are internal spaces (precursor gas primary diffusion spaces 304, intermediate gas distribution holes 306, source gas secondary diffusion spaces 305) in the dividing plate 324, so as to completely prevent or minimize the penetration of radicals into the internal spaces in dividing plate 324 from the holes 308 through which the radicals pass.

In the embodiment shown in FIG. 4, the plurality of holes 308 through which the radicals pass are formed by piercing through at positions where internal spaces (precursor gas primary diffusion spaces 304, intermediate gas distribution holes 306, source gas secondary diffusion spaces 305) are not disposed in the plurality of laminated plates (upper plate 301, intermediate diffusion plate 302, and gas discharge plate 303 on the film deposition side) that are laminated and connected together by securely bonding them over the interfacial surface area, but as mentioned above, since the entire interfacial surfaces of the plurality of laminated plates may be connected except at parts where there are internal holes inside dividing plate 324, there is little or no penetration of the radicals passing through holes 308 into the internal spaces in dividing plate 324, and there is little or no danger of radicals coming into contact with the precursor gas in the spaces inside dividing plate 324.

With the embodiment shown in FIG. 4, since there is no need for members such as rivets 11 or metal fixings 12 to connect together the plurality of laminated plates (upper plate 301, intermediate diffusion plate 302, and gas discharge plate 303 on the film deposition side) by closely bonding them over the entire interfacial area (or a large part thereof) as in the embodiments shown in FIGS. 2 and 3, it is possible to provide a dividing plate at lower cost. Furthermore, there is no need for a process to attach the plurality of rivets or metal fixings, and it can instead be bonded together with a single operation, allowing a dividing plate to be provided with more stable quality.

Note that in each of the above-mentioned embodiments, if the holes 8, 108, 208, 308 through which the radicals pass are formed so as to satisfy the condition $uL/D > 1$, where u is the gas flow velocity inside these holes, L is the effective length of the holes (in the above-mentioned embodiments, this length is equivalent to the thickness of dividing plate), and D is the gas interdiffusion coefficient (the gas interdiffusion coefficient of the precursor gas and the gas introduced in the plasma discharge space at the holes), then this is advantageous because it is possible to prevent the reverse diffusion of precursor gas introduced into film deposition process space 26 towards plasma discharge space 25.

FIG. 5 shows a rough view of one example of a thin-film deposition apparatus according to the present invention wherein the interior of the vacuum reaction chamber 22 is divided into two chambers by the above-mentioned dividing plate 124 shown in FIG. 2. The thin-film deposition apparatus shown in FIG. 5 deposits a silicon oxide film as a gate insulation film on the surface of a glass substrate 21 as normally used for TFTs (e.g., a glass substrate measuring 370 mm×470 mm), preferably using silane as the precursor gas. In this figure, however, dividing plate 24—which is the characteristic structural part in the thin-film deposition apparatus according to the present invention—is shown expanded in relation to the other parts, and the parts other than dividing plate 124 are only shown in sketch form.

An embodiment of the thin-film deposition apparatus according to the present invention is described with reference to FIG. 5.

The interior of vacuum reaction chamber 22 is divided into two (upper and lower) chambers by a dividing plate 124 (shown in FIG. 2) held at ground potential, the upper chamber forming a plasma discharge space 25, and the lower chamber forming a film deposition process space 26. A planar electrode (high frequency electrode) 30 is attached in such a way that the sides around its perimeter come into contact with the upper insulating member 34 of the insulating members 34, 35 interspersed between the upper enclosure constituting vacuum reaction chamber 22, and the lower part of its perimeter comes into contact with the lower insulating member 35. Dividing plate 124 has the desired characteristic thickness and has an overall flat shape, and has a planar profile resembling the horizontal cross-sectional profile of vacuum reaction chamber 22.

In the thin-film deposition apparatus shown in FIG. 5, the region in which an oxygen plasma 32 is produced inside plasma discharge space 25 is formed by the dividing plate 124, the upper part of the enclosure constituting vacuum reaction chamber 22, and from electrode 30 which is disposed more or less centrally between them. A plurality of holes 30a are formed in electrode 30.

A glass substrate 21 is carried into the interior of vacuum reaction chamber 22 by a transfer robot (not illustrated), and is placed on a substrate holding assembly 27 which is held at earth potential, which is the same potential as vacuum enclosure 22. The substrate holding assembly 27 provided in film deposition process space 26 is already held at the prescribed temperature because a current is made to flow through a heater 28.

The interior of vacuum reaction chamber 22 is pumped down, depressurized and held at the prescribed vacuum state by a pumping mechanism 23.

Next, oxygen gas is introduced into the plasma discharge space 25 through an oxygen gas inlet pipe 29.

Meanwhile, the precursor gas (e.g., silane) is introduced into source gas primary diffusion spaces 4 of dividing plate 24 through source gas inlet pipe 33. The silane first enters precursor gas primary diffusion spaces 4 where it is diffused, after which it passes through intermediate gas distribution holes 6 and enters source gas secondary diffusion space 5, during the course of which it is uniformly diffused, and it is then introduced directly into film deposition process space 26 from precursor gas discharge holes 7, i.e., it is introduced into film deposition process space 26 without coming into contact with the plasma or radicals.

In the above-mentioned state, high-frequency electrical power is supplied to electrode 30 via an electric power feed rod 31 which is insulated from the other metal parts. This high-frequency electrical power gives rise to a discharge, and an oxygen plasma 32 is produced around electrode 30 inside plasma discharge space 25. By producing oxygen plasma 32, radicals (excited active species), which are a neutral excited species, are produced, and these are introduced into the film deposition process space 26 through the plurality of holes 8 provided in dividing plate 124. Meanwhile, the precursor gas is introduced into the film deposition process space 26 through precursor gas primary diffusion spaces 4, intermediate gas distribution holes 6, precursor gas secondary diffusion spaces 5, and precursor gas discharge holes 7.

As a result, these radicals come into contact with the precursor gas for the first time inside film deposition process space 26, whereupon a chemical reaction takes place, and silicon oxide material accumulates on the surface of glass substrate 21, whereby a thin film is formed.

FIG. 6 shows a sketch of another embodiment of a thin-film deposition apparatus according to the present invention, where the interior of vacuum reaction chamber 22 is divided into two chambers by the dividing plate 124 shown in FIG. 2. The characteristic constitution of the embodiment shown in FIG. 6 is that an insulating member 34 is provided inside the ceiling part of the upper enclosure constituting vacuum reaction chamber 22, and that electrode 30 is disposed therebelow. Electrode 30 has the form of a single-layer planar electrode without holes 30a formed therein as in the case of the embodiment shown in FIG. 5. Plasma discharge space 25 is formed by a parallel planar electrode structure from electrode 30 and dividing plate 124. The other constituent parts are essentially the same as in the configuration of the embodiment shown in FIG. 5. Therefore, all elements in FIG. 6 that are essentially the same as those in FIG. 5 are identified with the same reference numerals, and their detailed descriptions will not be repeated here. Furthermore, since the action and advantages of the thin-film deposition apparatus according to the embodiment shown in FIG. 6 are the same as those of the above-mentioned embodiment shown in FIG. 5, their description will not be repeated here.

In the above-mentioned preferred embodiments of the present invention, the plurality of laminated plates constituting dividing plate 124, 224, 324 are configured from three plates (upper plate 101, 201, 301, intermediate plate 102, 202, 302 and gas discharge plate 103, 203, 303 on the film deposition side), but the embodiments of the present invention are not limited to this number. As long as the dividing plate has internal spaces formed therein (e.g., precursor gas primary diffusion spaces 104, 204, 304, intermediate gas distribution holes 106, 206, 306, source gas secondary diffusion spaces 105, 205, 305, and the like) which are separated from the plasma discharge space 25 and connected with film deposition process space 26, it is possible to use a dividing plate 124, 224, 324 that is laminated from two plates that are fixed or connected by securely bonding them over their entire interfacial surface area, or a large portion thereof, and it is also possible to configure dividing plate 124, 224, 324 from 4 or 5 plates.

The present invention relates to a thin-film deposition apparatus wherein the interior of the vacuum reaction chamber is divided into a plasma discharge space and a film deposition process space by a dividing plate having a plurality of holes through which radicals pass, radicals are generated from the plasma by introducing a gas into the plasma discharge space, these radicals are introduced into the film deposition process space through the plurality of holes in the above-mentioned dividing plate, and a precursor gas is introduced into the film deposition process space, whereby the above-mentioned introduced radicals react with the precursor gas in the film deposition process space and a film is deposited on a substrate disposed in the film deposition process space, and it is able to prevent the radicals produced in the plasma discharge space from penetrating into the spaces inside the dividing plate, which would result in the radicals coming into contact with the precursor gas inside the internal spaces of the dividing plate.

That is, with the present invention, it is not only possible to solve the problem of radicals penetrating the internal spaces of the dividing plate (which causes problems by generating particles that block the precursor gas discharge holes 7), but it is also possible to solve the problem of precursor gas leaking into the plasma discharge space, and as a result it is possible to prevent excessive breakdown of the precursor gas and it is possible to obtain thin films with favorable film quality.

Although preferred embodiments of the present invention have been described above with reference to the accompanying figures, the present invention is not limited to these embodiments, and can be modified in a variety of ways within the scope of the art as understood from the scope of the patent claims.

What is claimed is:

1. A thin-film deposition apparatus, comprising:
    a vacuum reaction chamber and a dividing plate, the vacuum reaction chamber is divided by the dividing plate into a plasma discharge space and a film deposition process space,
    the dividing plate having at least one internal space and a plurality of holes therein, the internal space is separated from said plasma discharge space and the internal space is connected with the film deposition process space, the plurality of holes connect the plasma discharge space with the film deposition process space, and a plasma is used to generate radicals in the plasma discharge space, which radicals are introduced into the film deposition process space through the plurality of holes in the dividing plate, and a precursor gas is directly introduced into the film deposition process space from the internal space, whereby the radicals and precursor gas introduced into the film deposition process space react together to deposit a film on a substrate disposed in the film deposition process space,
    the dividing plate is made of at least three plates laminated together by securely bonding them over substantially an entire area of their interfacial surfaces so as to separate the radicals generated in the plasma discharge space from the precursor gas while the precursor gas is in the internal space,
    wherein the internal space is divided at least into first and second diffusion sections by a middle one of the plates, and the middle plate includes a plurality of distribution holes interconnecting the first and second diffusion sections, wherein the first diffusion section includes an inlet through which the precursor gas is introduced into the first diffusion section, and the second diffusion section includes a plurality of discharge holes through which the diffused precursor gas can enter the film deposition process space,
    wherein the dividing plate is arranged in the vacuum reaction chamber such that the only communication between the plasma discharge space and the film deposition process space is through the plurality of holes, and
    wherein the plurality of holes have a diameter such that the precursor gas introduced into the film deposition process space is prevented from diffusing through the plurality of holes toward the plasma discharge space and are formed so as to satisfy the condition uL/D>1 during operation of the apparatus, where u is the gas flow velocity inside the holes, L is the effective length of the holes, and D is the gas interdiffusion coefficient.

2. A thin-film deposition apparatus, comprising:
    a vacuum reaction chamber and a dividing plate, the vacuum reaction chamber is divided by the dividing plate into a plasma discharge space and a film deposition process space, the dividing plate having internal spaces and a plurality of holes therein, the internal spaces are separated from said plasma discharge space and the internal spaces are connected with the film deposition process space, the plurality of holes connect the plasma discharge space with the film deposition process space, and a plasma is used to generate radicals in the plasma discharge space, which radicals are introduced into the said film deposition process space through the plurality of holes in the dividing plate, and a precursor gas is directly introduced into the film deposition process space from the internal spaces, whereby the radicals and precursor gas introduced into the film deposition process space react together to deposit a film on a substrate disposed in the film deposition process space,
    the dividing plate is made of a plurality of laminated plates connected together by securely bonding them over substantially an entire area of their interfacial surfaces so as to separate the radicals generated in the plasma discharge space from the precursor gas while the precursor gas is in the internal spaces,
    wherein the dividing plate is fixed by caulking with a plurality of metal fixings to securely bond the plurality of laminated plates over the entire area of their interfacial surfaces, and the plurality of holes provided in the dividing plate are provided through the plurality of metal fixings.

3. The thin-film deposition apparatus according to claim 1, wherein the dividing plate is configured by screwing a plurality of metal fixings provided with threaded parts on the outside thereof into the plurality of laminated plates, thereby securely bonding them over the entire area of their interfacial surfaces, and the plurality of holes provided in the dividing plate are provided through the plurality of metal fixings.

4. The thin-film deposition apparatus according to claim 1, wherein the dividing plate is made by connecting together the laminated plates by securely bonding them over the entire area of their interfacial surfaces, and the plurality of holes provided in the dividing plate are formed by piercing through it at positions where the internal space is not disposed.

5. The thin-film deposition apparatus according to claim 2, wherein the plurality of holes are formed so as to satisfy the condition uL/D>1, where u is the gas flow velocity inside the holes, L is the effective length of the holes, and D is the gas interdiffusion coefficient.

6. A thin-film deposition apparatus, comprising:
    a vacuum reaction chamber; and
    a dividing plate separating the vacuum reaction chamber into a plasma discharge space and a film deposition space;
    the dividing plate includes a at least three plates laminated together at their interfacial surfaces and having at least one internal space that is connected to the film deposition space, the dividing plate further having a plurality of holes that connect the plasma discharge space to the film deposition space, and which plurality of holes are distinct from the internal space, wherein the dividing plate is made of electrically conductive material;
    wherein the plurality of plates are bonded together over a sufficiently large portion of the interfacial surfaces so as to prevent radicals passing through the plurality of holes from passing between any of the plurality of plates into the internal space so as to separate the radicals generated in the plasma discharge space from a precursor gas while the precursor gas is in the internal space, wherein the plurality of plates are bonded together at an outer periphery thereof and in at least some portions of the laminated plates that are within the outer periphery, wherein the dividing plate is arranged in the vacuum reaction chamber such that the only communication between the plasma discharge space and the film deposition process space is through the plurality of holes, wherein the internal space is divided at least into first and second diffusion sections by a middle one of the plates, and the middle plate includes a plurality of distribution holes interconnecting the first and second diffusion sections, wherein the first diffusion section includes an inlet through which the precursor gas is introduced into the first diffusion section, and the second diffusion section includes a plurality of discharge holes through which the diffused precursor gas can enter the film deposition process space, wherein the plurality of holes have a diameter such that the precursor gas introduced into the film deposition process space is prevented from diffusing through the plurality of holes toward the plasma discharge space and are formed so as to satisfy the condition $uL/D>1$ during operation of the apparatus, where u is the gas flow velocity inside the holes, L is the effective length of the holes, and D is the gas interdiffusion coefficient.

7. The thin-film deposition apparatus according to claim 6, wherein the plurality of plates are bonded together by a plurality of rivets.

8. The thin-film deposition apparatus according to claim 6, wherein the plurality of plates are bonded together by a plurality of threaded fasteners.

9. The thin-film deposition apparatus according to claim 7, wherein the plurality of holes extend through the rivets.

10. The thin-film deposition apparatus according to claim 8, wherein the plurality of holes extend through the threaded fasteners.

11. The thin-film deposition apparatus according to claim 6, wherein all of the interfacial surfaces are bonded together.

12. A dividing plate for a thin-film deposition chamber having a vacuum reaction chamber that includes a plasma discharge space and film deposition space, the dividing plate comprising:
at least three plates laminated together at their interfacial surfaces;
at least one internal space within the dividing plate, the internal space being connected to the film deposition space; and
a plurality of holes extending through the dividing plates so as to connect the plasma discharge space and the film deposition space, the plurality of holes being distinct from the internal space;
wherein the plurality of plates are bonded together over a sufficiently large portion of the interfacial surfaces so as to prevent radicals passing through the plurality of holes from passing between any of the plurality of plates into the internal space so as to separate the radicals generated in the plasma discharge space from a precursor gas while the precursor gas is in the internal space, wherein the plurality of plates are bonded together at an outer periphery thereof and in at least some portions of the laminated plates that are within the outer periphery, wherein the dividing plate is made of electrically conductive material, wherein the dividing plate is arranged in the vacuum reaction chamber such that the only communication between the plasma discharge space and the film deposition process space is through the plurality of holes, wherein the internal space is divided at least into first and second diffusion sections by a middle one of the plates, and the middle plate includes a plurality of distribution holes interconnecting the first and second diffusion sections, wherein the first diffusion section includes an inlet through which the precursor gas is introduced into the first diffusion section, and the second diffusion section includes a plurality of discharge holes through which the diffused precursor gas can enter the film deposition process space, and wherein the plurality of holes have a diameter such that the precursor gas introduced into the film deposition process space is prevented from diffusing through the plurality of holes toward the plasma discharge space and are formed so as to satisfy the condition $uL/D>1$ during operation of the apparatus, where u is the gas flow velocity inside the holes, L is the effective length of the holes, and D is the gas interdiffusion coefficient.

13. The dividing plate of claim 12, wherein the plurality of plates are bonded together by a plurality of rivets.

14. The dividing plate of claim 12, wherein the plurality of plates are bonded together by a plurality of threaded fasteners.

15. The dividing plate of claim 13, wherein the plurality of holes extend through the rivets.

16. The dividing plate of claim 14, wherein the plurality of holes extend through the threaded fasteners.

17. The dividing plate of claim 12, wherein all of the interfacial surfaces are bonded together.

18. A thin-film deposition apparatus, comprising:
a vacuum reaction chamber;
means for dividing the vacuum reaction chamber into a plasma discharge space and a film deposition space;
the dividing means includes at least one internal space for retaining a precursor gas, said internal space being connected to the film deposition space;
the dividing means further including means, distinct from the internal space, for communicating radicals from the plasma discharge space to the film deposition space;
the dividing means including at least three plates bonded together over a sufficiently large portion of their interfacial surfaces so as to prevent radicals passing through the communicating means from passing between any of the plurality of plates into the internal space so as to separate the radicals generated in the plasma discharge space from a precursor gas while the precursor gas is in the internal space, wherein the dividing means is made of electrically conductive material, wherein the dividing means is arranged in the vacuum reaction chamber such that the only communication between the plasma discharge space and the film deposition process space is through the communicating means, and wherein the internal space is divided at least into first and second diffusion sections by a middle one of the plates, and the middle plate includes a plurality of distribution holes interconnecting the first and second diffusion sections, wherein the first diffusion section includes an inlet through which the precursor gas is introduced into the first diffusion section, and the second diffusion section includes a plurality of discharge holes through which the diffused precursor gas can enter the film deposition process space, wherein the plurality of holes have a diameter such that the precursor gas introduced into the film deposition process space is prevented from diffusing through the plurality of holes toward the plasma discharge space and are formed so as to satisfy the condition $uL/D>1$ during operation of the apparatus, where u is the gas flow velocity inside the holes, L is the effective length of the holes, and D is the gas interdiffusion coefficient.

19. The thin-film deposition apparatus according to claim 18, wherein the plurality of plates are bonded together over substantially all of their interfacial surfaces.

20. The thin-film deposition apparatus according to claim 18, wherein all of the interfacial surfaces are bonded together.

21. The thin film deposition apparatus according to claim 1, wherein the dividing plate is made of an electrically conductive material.

22. The thin-film deposition apparatus according to claim 21, wherein the dividing plate is fixed by caulking with a plurality of metal fixings to securely bond the plurality of laminated plates over the entire area of their interfacial surfaces, and the plurality of holes provided in the dividing plate are provided through the plurality of metal fixings.

23. The thin-film deposition apparatus according to claim 21, wherein the dividing plate is made by connecting together a plurality of laminated plates by securely bonding them over the entire area of their interfacial surfaces, and the plurality of holes provided in the dividing plate are formed by piercing through it at positions where the internal space is not disposed.

24. The thin-film apparatus according to claim 1, wherein the dividing plate includes a plurality of internal spaces.

* * * * *